United States Patent
Fiorani (10) Patent No.: US 11,483,933 B2
(45) Date of Patent: Oct. 25, 2022

(54) METHOD AND EQUIPMENT FOR THE TREATMENT OF PANELS

(71) Applicant: WISE S.R.L., Parma (IT)

(72) Inventor: Massimo Fiorani, Parma (IT)

(73) Assignee: WISE S.R.L., Parma (IT)

( * ) Notice: Subject to any disclaimer, the term of this patent is extended or adjusted under 35 U.S.C. 154(b) by 203 days.

(21) Appl. No.: 16/626,859

(22) PCT Filed: Jun. 29, 2018

(86) PCT No.: PCT/IB2018/054847
§ 371 (c)(1),
(2) Date: Dec. 26, 2019

(87) PCT Pub. No.: WO2019/021086
PCT Pub. Date: Jan. 31, 2019

(65) Prior Publication Data
US 2020/0245467 A1    Jul. 30, 2020

(30) Foreign Application Priority Data

Jul. 24, 2017 (IT) .................. 102017000083957

(51) Int. Cl.
*H05K 3/00* (2006.01)
*H05K 3/26* (2006.01)
*H05K 3/38* (2006.01)

(52) U.S. Cl.
CPC ............. *H05K 3/0055* (2013.01); *H05K 3/26* (2013.01); *H05K 3/381* (2013.01); *H05K 2203/095* (2013.01)

(58) Field of Classification Search
CPC ........ H05K 3/381; H05K 3/0055; H05K 3/26; H05K 2203/095
See application file for complete search history.

(56) References Cited

U.S. PATENT DOCUMENTS 4,252,595 A * 2/1981 Yamamoto ............. B23K 28/00
                                                  156/345.31
4,840,702 A * 6/1989 Schumacher, III ....... C23F 4/00
                                                         134/1

(Continued)

FOREIGN PATENT DOCUMENTS

| DE | 102008028167 A1 | 12/2009 |
| EP | 1244136 A2 | 9/2002 |
| JP | 2003283124 A | * 10/2003 |

*Primary Examiner* — Jeffrey T Carley
(74) *Attorney, Agent, or Firm* — Browdy and Neimak, PLLC (57) ABSTRACT

Description of a method and equipment for panel (900) treatment in the manufacture of printed circuit boards that includes the following phases: setting up a panel (900) with a first side (905), a second side (910) opposite the first side, and at least one through hole (915) in the thickness of the panel; positioning the opening (205) for an intake system (200) in contact with the first side (905) of the panel (900) so this opening (205) delimits a portion on the first side (905) containing the through hole (915); creating negative pressure within the intake system (200) and simultaneously exposing at least one portion on the second side (910) of this panel (900) to a flow of plasma, whereby this portion on the second side (910) contains the through hole (915).

16 Claims, 6 Drawing Sheets

(56) References Cited

U.S. PATENT DOCUMENTS

| | | | | |
|---|---|---|---|---|
| 5,441,474 A * | 8/1995 | Morofuji | ............... | B23Q 3/069 |
| | | | | 408/1 R |
| 6,006,763 A * | 12/1999 | Mori | ........................ | C23C 8/40 |
| | | | | 134/1.1 |
| 6,012,509 A * | 1/2000 | Nonaka | ............... | H01L 21/6838 |
| | | | | 165/80.2 |
| 6,808,592 B1 * | 10/2004 | Rigali | ............... | H01J 37/32082 |
| | | | | 118/719 |
| 6,972,071 B1 * | 12/2005 | Tyler | ............... | H01J 37/32357 |
| | | | | 118/715 |
| 9,378,969 B2 * | 6/2016 | Hsu | .................... | H01L 21/3065 |
| 2001/0019177 A1 * | 9/2001 | Sugihara | ............. | H01L 21/4853 |
| | | | | 257/780 |
| 2002/0195202 A1 * | 12/2002 | Arita | .................. | H01J 37/3244 |
| | | | | 156/345.47 |
| 2003/0000830 A1 * | 1/2003 | Spain | .................. | H05K 3/0088 |
| | | | | 204/194 |
| 2009/0084412 A1 * | 4/2009 | Ramanan | ............... | B08B 3/022 |
| | | | | 134/26 |
| 2013/0017367 A1 * | 1/2013 | Ravagnan | ............... | C23C 14/22 |
| | | | | 428/209 |

\* cited by examiner

METHOD AND EQUIPMENT FOR THE TREATMENT OF PANELS

TECHNICAL FIELD

This invention concerns a method and equipment for the plasma treatment of panels in the manufacture of printed circuit boards.

PRIOR ART

As is widely known, printed circuit boards are usually manufactured starting with a non-conductive, usually fibreglass panel with at least one side completely covered with an electrically conductive metal sheet, usually copper.

To obtain the printed circuit board this panel undergoes a set of consecutive treatments, some of which [e.g. dry film or solder mask lamination, hot air solder levelling (HASL), plating] involve this panel being coated with additional welding materials such as polymers, metals and/or carbon and possible derivatives.

To enable this, the surfaces of the panel must be prepared and activated several times so they adhere securely to the welding materials applied to them.

Conventionally, this surface preparation is obtained by treating the panel with special chemical processes or mechanical brushing processes and/or the addition of abrasive solutions, giving the metal sheet and other parts of the panel a suitably rough surface.

However, chemical processes are usually rather expensive and complex, and increase the environmental impact of the entire production process significantly, whereas mechanical processes have the disadvantage of not always ensuring sufficiently uniform results, and affect the performance of the completed electronic board considerably.

Solutions have recently been introduced in an attempt to overcome these issues, which involve preparing and activating the surfaces of the panel by exposing it to a flow of plasma.

This flow of plasma basically increases the surface energy of the panel sides it comes into contact with, significantly increasing their ability to adhere to subsequent layers applied, without requiring the use of chemical baths or mechanical processes and without changing the surface structure of the metal sheet, which can remain perfectly smooth.

However panels designed for the manufacture of printed circuit boards are sometimes provided with through holes, which may be required to make anchoring points for electronic components for example, or to make conducting sections designed to connect printed circuit boards on both sides of the panel and/or printed circuit boards on different overlapping panels to obtain multilayer boards.

As a result, the internal surfaces of these through holes must also undergo one or more preparation and activation phases, to make them suitable for subsequent HASL or plating processes for example.

In these cases though, the flow of plasma which is directed onto the sides of the panel is not able to penetrate the through holes effectively and activate the surfaces sufficiently, so the effectiveness of the treatment can be compromised.

ILLUSTRATION OF THE INVENTION

In light of the above, an aim of this invention is to overcome the aforementioned issues relating to the prior art by offering a solution at a relatively contained cost which is simple and practical.

This and the other aims are achieved thanks to the characteristics of the invention outlined in the independent claims, whereas the dependent claims illustrate the preferred and/or particularly beneficial aspects of the invention.

In particular, one way of implementing this invention provides a method for treating panels in the manufacture of printed circuit boards and includes the following phases:

setting up a panel with a first side, a second side opposite the first side, and at least one through hole in the thickness of the panel;

positioning the opening for an intake system in contact or almost in contact with the first side of the panel so this opening delimits a portion on the first side containing the through hole;

creating negative pressure within the intake system and simultaneously exposing at least one portion on the second side of this panel to a flow of plasma, whereby this portion on the second side contains the through hole.

Thanks to this solution, the flow of plasma reaching the second side of the panel is basically sucked inside the through hole, so the plasma also reaches the inner surfaces of the through hole and activates them appropriately, so they can be coated with additional welding materials such as polymers, metals and/or carbon and possibly derivatives for the purpose of HASL processes or plating for example.

According to one aspect of the invention, the opening for the intake system can be completely contained within the body of the panel.

By doing so, the opening for the intake system is completely enclosed within the panel, with the exception of the through hole/s to be treated, therefore the suction effect only occurs (or almost) in the through hole/s on the panel, maximising the amount of plasma sucked in and hence the benefits of the treatment.

According to another aspect of the invention, the portion on the first side of the panel which is delimited by the opening on the intake system can be as wide as the diameter of the portion on the second side exposed to the flow of plasma.

This aspect also has the effect of concentrating suction in as limited an area as possible that contains the through hole/s to be treated and the flow of plasma reaching it.

An additional aspect of the invention involves the flow of plasma being directed in parallel with the axis of the through hole.

Doing this further facilitates the penetration of the plasma inside the through hole/s.

The invention also involves corresponding equipment to treat the panels, comprising the following at least:

a support surface for the panel to be treated, an intake system with an opening designed to remain in or almost in contact with the first side of a panel situated on the support surface, a nozzle dispensing a flow of plasma, which is placed at the opposite end of the support surface with respect to the intake system and is designed to supply a flow of plasma to the second side of a panel opposite the first side, and a suction mechanism to reduce pressure in the intake system.

This equipment makes it possible to apply the above method simply and practically to achieve the resulting benefits, especially that of facilitating the penetration of the plasma in any through holes in the panel.

According to one aspect of the invention, the support surface can feature an actuating mechanism designed to feed the panel in a preset feeding direction.

Thanks to this solution the equipment enables gradual continuous treatment of the entire surface of the panel, making it extremely effective in production terms.

In particular, the support surface can be defined by a roller bed and the actuating mechanism can be motors designed to rotate one or more rollers on the roller bed.

In practice, the use of a roller bed is a simple effective solution that enables the panel to move forward without interfering with the nozzle dispensing the flow of plasma or with the intake system.

According to one method of implementing the invention, the opening for the intake system can be positioned flush with the support surface.

This solution is especially beneficial in the case where the intake system is positioned at the opposite end of the support surface with respect to the panel to be treated.

In this case, when the panel on the support surface is placed at the intake system it is automatically in or almost in contact with the opening on the intake system too, without requiring additional devices.

A different method of implementing the invention may involve the equipment comprising a means for varying the distance of the intake system with respect to the support surface.

This solution is especially beneficial in the case where the intake system is positioned at the same end of the support surface as the panel to be treated.

In this case, the distance between the opening for the intake system and the support surface can be adjusted as required on the basis of the thickness of the panel to be treated.

According to one aspect of the invention, the dimensions of the opening for the intake system can be adjustable.

As a result the equipment can be adapted to different panel shapes, such that the opening of the intake system is always contained within the body of the panel on any of them for example, as envisaged for one of the aspects of the method outlined previously.

In this context, one aspect of the invention involves the equipment comprising the following:
sensors to measure the size of the panel situated on the support surface,
actuating mechanism to adjust the size of the opening for the intake system,
a control unit connected to the sensors and actuating mechanism configured to adjust the size of the opening for the intake system in relation to the size of the panel measured by the sensors.

Thanks to this solution, adjusting the size of the opening for the intake system becomes a fully automatic process.

According to another aspect of the invention, the equipment can also comprise:
sensors to detect the presence of the through holes in the panel situated on the support surface and their position with respect to the intake system, and
a control unit connected to these sensors and configured to selectively activate the suction mechanism, when at least one of these through holes is contained in a portion on the first side of the panel which is delimited by the opening for the intake system.

Consequently, the suction mechanism is only activated selectively when it is actually possible to draw the plasma into the through hole/s to be treated, whereas the suction effect is disabled in other cases, saving energy and facilitating the panel's feeding along the support surface considerably.

Another aspect of the invention involves the equipment comprising the following:
a perforated belt with a first side designed for contact with a panel,
an intake system with an opening facing a second side of the perforated belt opposite the first side,
a suction mechanism to reduce pressure in the intake system, and
a nozzle dispensing a flow of plasma, which is placed at the opposite end of the perforated belt with respect to the intake system and is designed to supply a flow of plasma to the first side of the perforated belt.

Thanks to this aspect, which could be the subject of an independent invention with respect to the previous details outlined, the perforated belt assisted by the back suction effect makes it possible to tilt the panel securely or, even better, hold the panel from its upper side to apply the plasma treatment to the lower side for example.

In this context, a preferred aspect of the invention is for the perforated belt to be able to slide.

This would enable effective handling of the panel during the production process.

BRIEF DESCRIPTION OF DIAGRAMS

Additional characteristics and benefits of the invention will be evident from reading the description below, which is an example and is not exhaustive, with the assistance of the diagrams shown in the tables attached.

DETAILED DESCRIPTION

The equipment 100 shown in FIGS. 1-4 has been designed to apply plasma treatment to panels 900 when manufacturing printed circuit boards.

Figure 2:
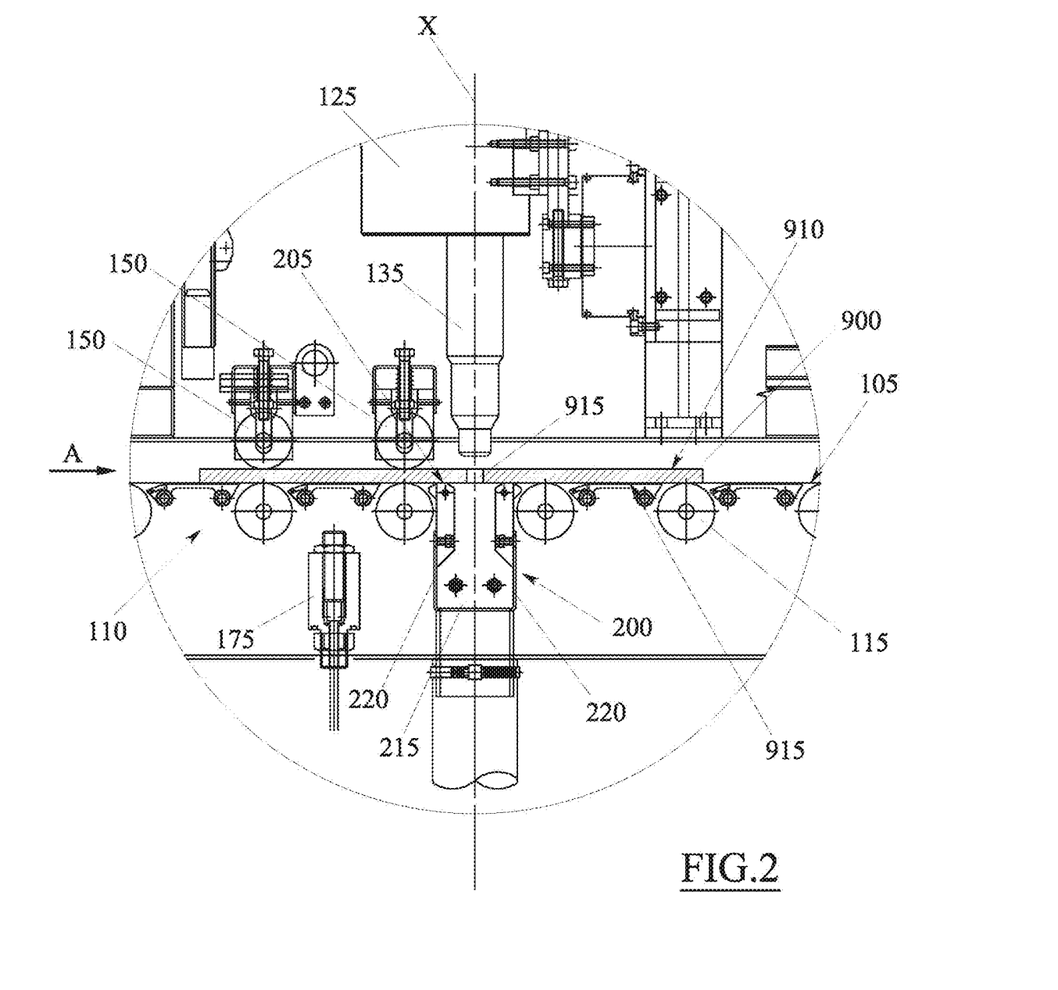
FIG. 2 shows enlarged details of FIG. 1, with a panel whose dimensions (especially thickness) have been enlarged to help identify the features.

Each panel 900 basically has the form of a plate, which is typically thin with two wide reciprocally opposite sides, a first side 905 and a second side 910 (see FIG. 2).

The panel 900 may have one or more through holes 915, each of which extends in the direction of the thickness between the first side 905 and second side 910 on the panel 900.

The panel 900 may be rigid or flexible. In some applications the panel 900 does not have to be completely flat and can be slightly bent or rounded.

The panel 900 can comprise an electrically non-conducting layer in the direction of its thickness, made of fibreglass for example (Vetronite), possibly coated on one or both sides with an electrically conducting metal sheet.

Depending on the stage reached in the manufacture of the printed circuit board, each metal sheet can cover the electrically non-conducting layer completely, or be cut to leave the metal conductors for the printed circuit board being made on the electrically conducting layer only.

As previously, depending on the stage reached in the manufacturing process, the panel 900 can also comprise other layers overlapping the metal sheets, such as a solder mask.

The plasma treatment in this description can be applied to the panel 900 during any intermediate phase in the electronic board's manufacturing process, and regardless of the materials/layers forming the panel 900 and defining its outer surfaces in that specific intermediate phase.

In particular, the aforementioned plasma treatment can be applied any time one or more panel 900 surfaces (considered as a semi-finished product for the completion of a printed circuit board) must be prepared and activated, for example to make them suitable for adhering to a welding material, such as polymers, metal and/or carbon and any derivatives.

The plasma treatment equipment 100 first and foremost comprises a support surface 105 designed for the panel 900 to rest on, possibly to remain in contact with the first side 905 for example.

As a result, the axes of the through holes 915 made in the panel 900 can be orthogonal to the support surface 105.

Figure 1:
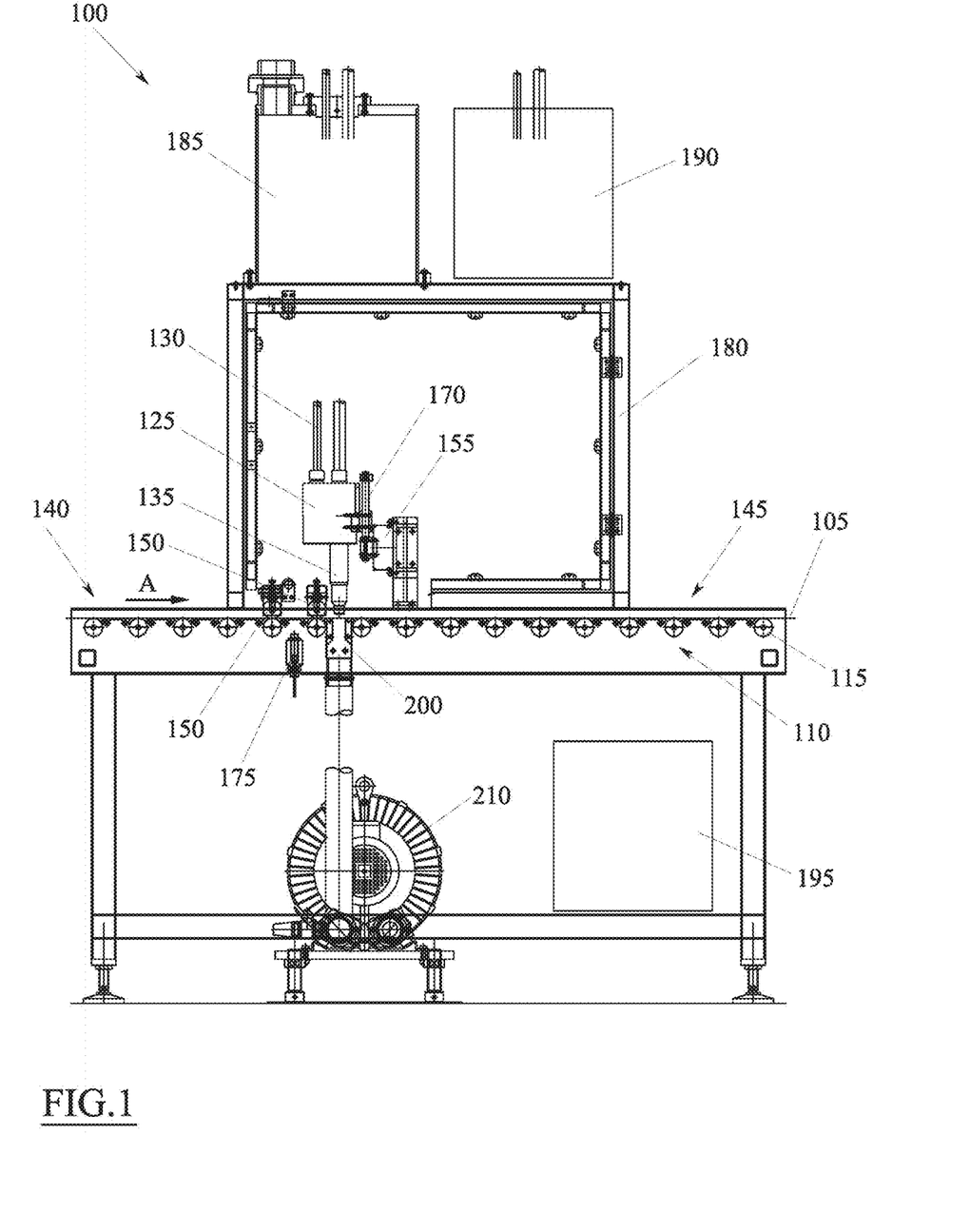
FIG. 1 is a side view of the equipment in accordance with one method of implementing this invention.

In the example illustrated, the support surface 105 is provided by a roller bed 110, which generally comprises numerous rollers 115 arranged in parallel in the same plane.

The rollers 115 can be connected to a motor 120 designed to turn them and feed the panel 900 in a set horizontal travel direction A.

In other types of implementation, the support surface 105 could be provided by devices other than the roller bed 110, which could still have a means of feeding the panels 900 in direction A. The support surface 105 could be provided by several consecutive conveyor belts for example.

In the example illustrated in the diagrams it can also be observed that the support surface 105 is completely horizontal, but it could also be tilted in other types of implementation.

On one side above the support surface 105 the equipment 100 comprises at least one dispensing nozzle 125 to supply a flow of plasma.

The dispensing nozzle 125 schematically comprises an internal chamber connected with a supply pipe 130 for the process gas and an outlet 135 for the ionised process gas.

Pressurised process gas is supplied continuously to the supply pipe 130, creating a flow of gas that crosses the internal chamber of the dispensing nozzle 125 towards the outlet 135.

There are at least two electrodes inside the chamber (not illustrated) which are arranged so they are electrically isolated from each other and come into contact with the process gas flowing in the dispensing nozzle 125.

These electrodes are electrically-powered until an electric arc is created that develops within the dispensing nozzle 125 and ionises the process gas in contact with the aforementioned electric arc, generating the plasma.

In this way, the process gas supplied into the dispensing nozzle 125 is continuously ionised and ejected externally as a flow of plasma, which moves in a straight line along the direction defined by the x-axis of the outlet 135 [see FIG. 2].

Thanks to this system the flow of plasma consists of plasma that is generated in the atmosphere and released freely into the air.

This plasma has the advantage of being especially efficient in surface activation processes, in addition to the benefit of not producing ozone or other harmful substances in quantities exceeding legal limits.

It is not excluded however that in other types of implementation the flow of plasma could be generated via systems that differ from those described, as long as they are suitable to eject it directly against the surfaces to be treated.

In some types of implementation the dispensing nozzle 125 can be combined with drive mechanisms designed to rotate it around the x-axis, leading to greater distribution of the flow of plasma.

The process gas used to generate the plasma may simply be air or a mix of different gases depending on requirements.

The flow of plasma generally has the shape of a cylindrical or sometimes cone-shaped beam with a diameter corresponding to the diameter of the outlet 135 or larger, between 20 mm and 100 mm for example.

In some types of implementation the flow of plasma may be substantially tubular or have a circular cross-section.

With regard to the equipment 100, the dispensing nozzle 125 is positioned such that the outlet 135 faces the support surface 105, so the flow of plasma is ejected towards the second side 910 on the panel 900 situated on the support surface 105 [see FIG. 2].

In particular, the dispensing nozzle 125 can be turned such that the x-axis of the outlet 135 is orthogonal to the support surface 105 or parallel to the axes of the through holes 915 made in the panel 900.

In accordance with the example illustrated, the outlet 135 of the dispensing nozzle 125 can be lined up, with respect to the x-axis, with the empty space between the two consecutive rollers 115 on the roller bed 110, ideally splitting the bed into an entry section (140) situated before the dispensing nozzle 125 and an exit section 145 situated after the dispensing nozzle 125 [see FIG. 1].

The rollers 115 on the entry section 140 can be made of rubber or covered with a layer of rubber, whereas the rollers 115 in the exit section 145 can be made of metal such as steel.

The entry section 140 of the roller bed 110 can be equipped with a centring system (not illustrated) designed to guide the panel 900 to a set position on the support surface 105, in addition to a pair of rollers 150 overlapping the rollers 115 positioned immediately above the dispensing nozzle 125 [with respect to the travel direction A] to hold the panels 900 securely on the support surface 105 during treatment.

In some types of implementation, the entry 140 and exit 145 sections could be made with two separate roller beds. In other types of implementation these two separate roller beds could be replaced with two conveyor belts placed one after the other as outlined previously.

The dispensing nozzle 125 can be installed on a suitable means of providing transverse movement to move it in a crosswise direction with respect to the support surface 105 along a direction B, parallel to the support surface 105 and perpendicular to the travel direction A of the panel 900.

Figure 3:
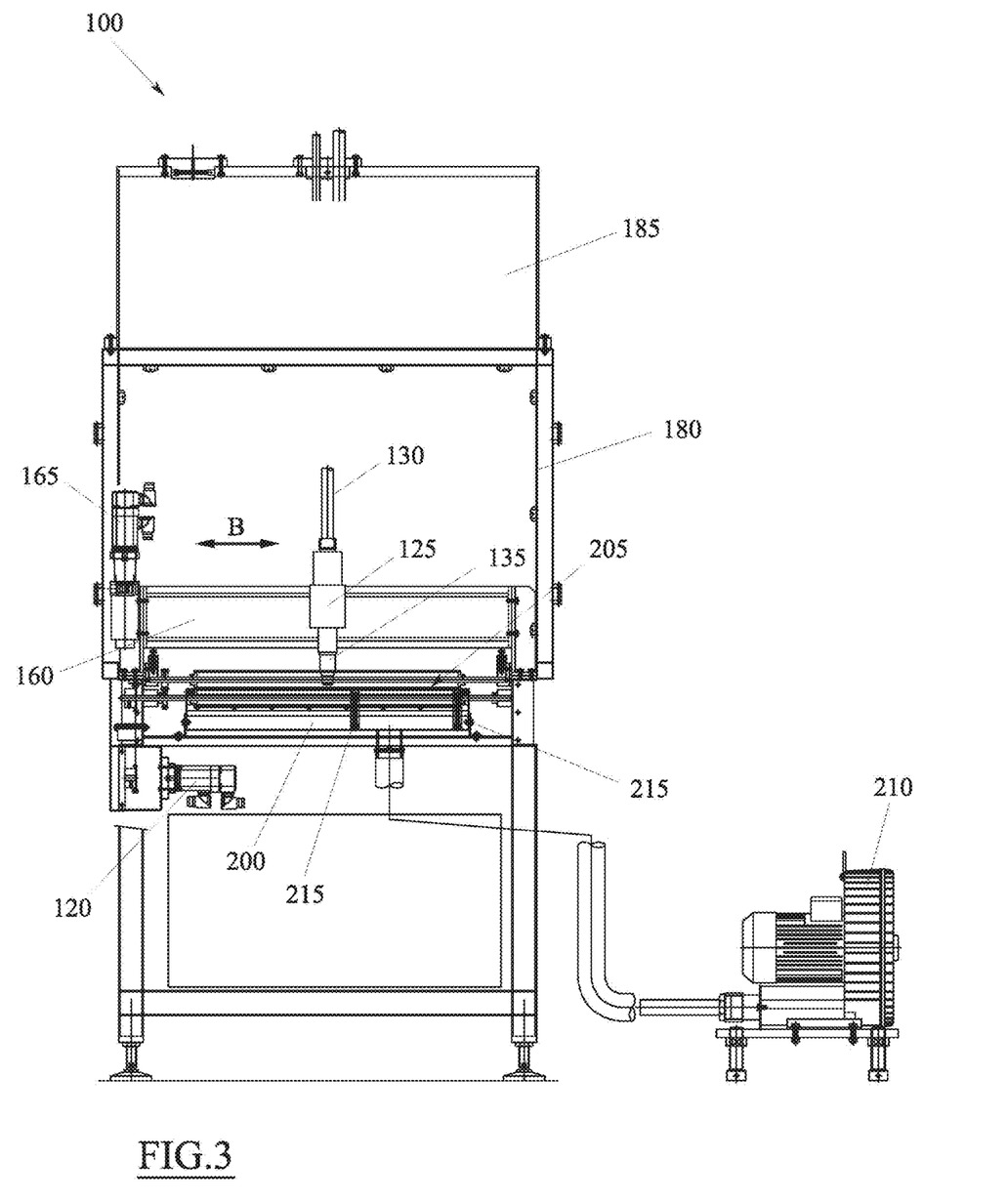
FIG. 3 is a front view of the equipment in FIG. 1.
Figure 4:
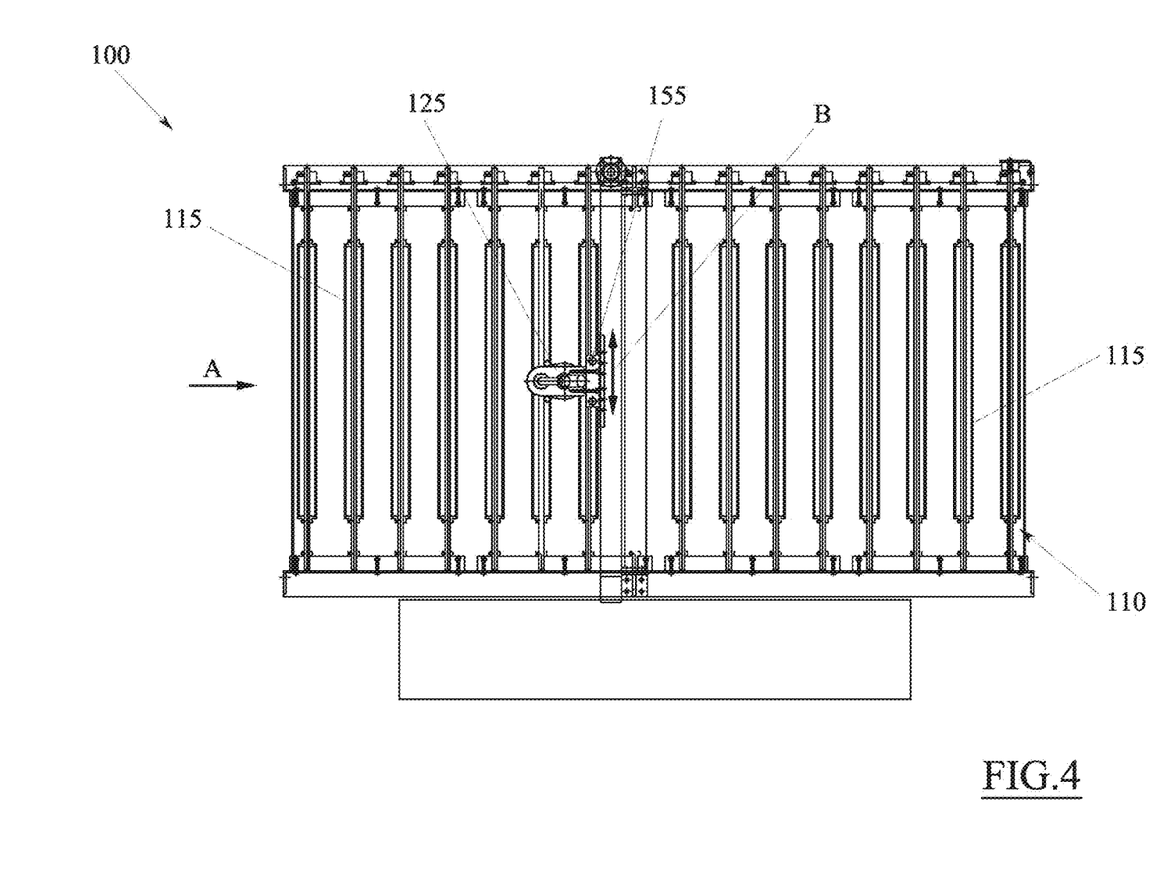
FIG. 4 is an overhead view of the equipment in FIG. 1.

This means of providing transverse movement may comprise a carriage 155 which carries the dispensing nozzle 125 and is coupled to a horizontal beam 160, where it can slide back and forth via a drive motor 165.

The equipment 100 may also comprise a second movement mechanism designed to move the dispensing nozzle 125 in a direction which is orthogonal to the support surface 105, or parallel to the x-axis of the outlet 135 so as to adjust the reciprocal distance between the support surface 105 and the dispensing nozzle 125.

This second movement mechanism may comprise a guide 170 fitted to the carriage 155 where the dispensing nozzle 125 can slide towards or away from the support surface 105 via a suitable drive system (not illustrated).

The movement mechanism for the dispensing nozzle 125 can be connected to an electronic control unit (not illustrated), which can also be connected to the drive motor 120 for the roller bed 110 and have a system designed to detect the position of the panel (900) on the support surface 105, such as a photocell 175.

As a result, when the panel 900 approaches the dispensing nozzle 125 the electronic control unit can activate the dispensing nozzle 125 first of all to generate and release the flow of plasma, and then to control the transverse movement mechanism to move the dispensing nozzle 125 back and forth along direction B.

In this way, by synchronising the movement of the panel 900 in the travel direction A and the reciprocating movement of the dispensing nozzle 125 in the crosswise direction B appropriately, the equipment 100 can effectively expose the entire second side 910 of the panel 900 to the flow of plasma, also passing any through holes 915.

The dispensing nozzle 125 can be housed and protected in an upper casing 180, which can also house the corresponding movement mechanism.

The upper casing 180 can also be combined with an extraction system 185 to extract the plasma dispersed into the environment around the panel 900 during treatment, in addition to a system 190 designed to supply the process gas to the dispensing nozzle 125, comprising a process gas mixing device 195 if necessary, which can be placed under the support surface 105.

The equipment 100 also comprises an intake system 200 positioned at the other side of the support surface 105 with respect to the dispensing nozzle 125 [see FIG. 2].

The intake system 200 is generally made of a hollow body with an opening 205 which is connected to a suction mechanism 210 designed to create negative pressure in the intake system 200 to draw air in through this opening 205.

The suction mechanism 210 may comprise a vacuum pump or other extraction fans connected to a drive motor such as an electric motor.

The opening 205 for the intake system 200 faces the dispensing nozzle 125 and is substantially in line with the x-axis of the outlet 135, or such that the x-axis of the outlet 135 lies in the opening 205 for the intake system 200.

It is preferable for the opening 205 for the intake system 200 to lie in a plane parallel to the support surface 105 and be able to extend further orthogonally to the travel direction A and in parallel, so the overall effect is to channel a stream of air inside the intake system 200.

In particular, the opening 205 for the intake system 200 can extend parallel to the travel direction A (width) and substantially equal to the diameter of the flow of plasma 'spot' generated by the dispensing nozzle 125 that is created on the second side 910 of the panel 900, or the diameter of the portion on this second side 910 that is immediately covered by the plasma beam.

In a direction which is orthogonal to the travel direction A however, the opening 205 for the intake system 200 can extend equal to the size (in the same direction) of the panel 900.

Whatever the option, it is preferable for the length of the opening 205 in the direction which is orthogonal to the travel direction A not to be larger than the corresponding length of the panel 900, so it is completely contained within the panel 900 when placed between the dispensing nozzle 125 and the intake system.

Given that panels 900 have different dimensions however, it is envisaged that the length of the opening 205 in the orthogonal direction can be adjusted.

For example, the opening 205 can be delimited by two side partitions 215 for the intake system 200 [see FIG. 3], which are reciprocally mobile in a direction parallel to the support surface 105 and orthogonal to the travel direction A, or in a direction parallel to the dispensing nozzle's 125 travel direction B.

It should be noted that the side partitions 215 can both be mobile or set up so that one is fixed and the other mobile.

The side partitions 215 can then be situated between two longitudinal walls 220 of the intake system 200 [see FIG. 2], which define the width of the opening 205 and whose reciprocal distance can be fixed.

The side partitions 215 can be moved back and forth manually or automatically using a suitable drive mechanism (not illustrated).

In particular, some types of implementation may involve the equipment 100 comprising sensors (not illustrated), such as special photocells and cameras, to measure the size of the panel 900 situated on the support surface 105, and an electronic control unit connected to these sensors and drive mechanism for the side partitions 215, which is configured to adjust the reciprocal position of the side partitions 215, and therefore the size of the opening 205 for the intake system 200, in relation to the size of the panel 900 measured by the sensors.

In the implementation example illustrated in FIGS. 1 to 4, the intake system 200 is scaled for insertion between the two rollers 115 on the roller bed 110, which represent the end of the entry section 140 and the start of the exit section 145 respectively, such that the opening 205 is flush (or in the same plane) with the support surface 105.

Consequently, when the panel 900 is between the dispensing nozzle 125 and the intake system 200, the opening 205 is in contact with the first surface 905 of the panel 900, so is closed, and a restricted portion of its surface where the suction effect from the suction mechanism 210 is applied is delimited (see FIG. 2).

Therefore when one or more of the through holes 915 on the panel 900 are within this restricted portion of the surface delimited by the opening 205 for the intake system 200 due to the panel 900 proceeding on the support surface 105, the flow of plasma reaching the second side 910 of the panel 900 is drawn inside these through holes 915 and also reaches the inner surfaces effectively.

This suction action can be maintained throughout the panel 900 treatment or, preferably, only activated when at least one through hole 915 is present at the opening 205 for the intake system 200, and disabled in all other cases.

By doing so it is possible to avoid hindering the progress of the panel 900, especially during the most critical treatment phases such as front and rear panel 900 treatment.

To obtain this effect, some methods of implementation may involve the equipment 100 having sensors (not illustrated) such as photocells or special cameras to detect the presence of through holes 915 in the panel 900 on the support surface 105, in addition to their position with respect to the opening 205 for the intake system 200, and an electronic control unit connected to these sensors and configured to activate the suction mechanism 210 only when the sensors indicate that at least one of these holes 915 is contained in the portion on the first side 905 of the panel 910, currently delimited by the opening 205 for the intake system 200, or disable it if not.

The suction mechanism 210 can be enabled and disabled by enabling and disabling the motor operating it, or through a bypass valve (not illustrated) that can connect and selectively disconnect the intake system 200 from the suction mechanism 210 while still keeping the latter operating.

It should be noted that some alternative methods of implementation could involve the equipment 100 differing from the aforementioned description by reversing the position of the dispensing nozzle 125 and the intake system 200 with respect to the panel 900 support surface 105.

In other words, with respect to the example illustrated, the intake system 200 could be above the support surface 105 and the dispensing nozzle 125 could be underneath the support surface 105, delivering the flow of plasma upwards to treat the first side 905 of the panel 900.

In this case the intake system 200 is still on the same side of the panel 900 to be treated, and its opening 205 must therefore be at a distance from the support surface 105 equivalent to the thickness of the panel 900 itself.

Given that the panels 900 could have different thicknesses, the equipment 100 may be equipped with a mechanism for varying the distance from the intake system 200 with respect to the support surface 105, enabling a direction of movement orthogonal to the support surface 105 for example.

This mechanism is within the scope of industry specialists therefore is not illustrated in greater detail.

It should be noted however that this mechanism need not only be used to adjust the distance of the intake system in relation to the thickness of the panel 900, but also to move the intake system 200 away from the panel 900, to facilitate its progress when there are no through holes 915 for example, and bring it into contact with the side of the panel 900 in other cases.

Obviously this latter solution could also be applied to the first type of implementation illustrated in FIGS. 1 to 4.

Figure 5:
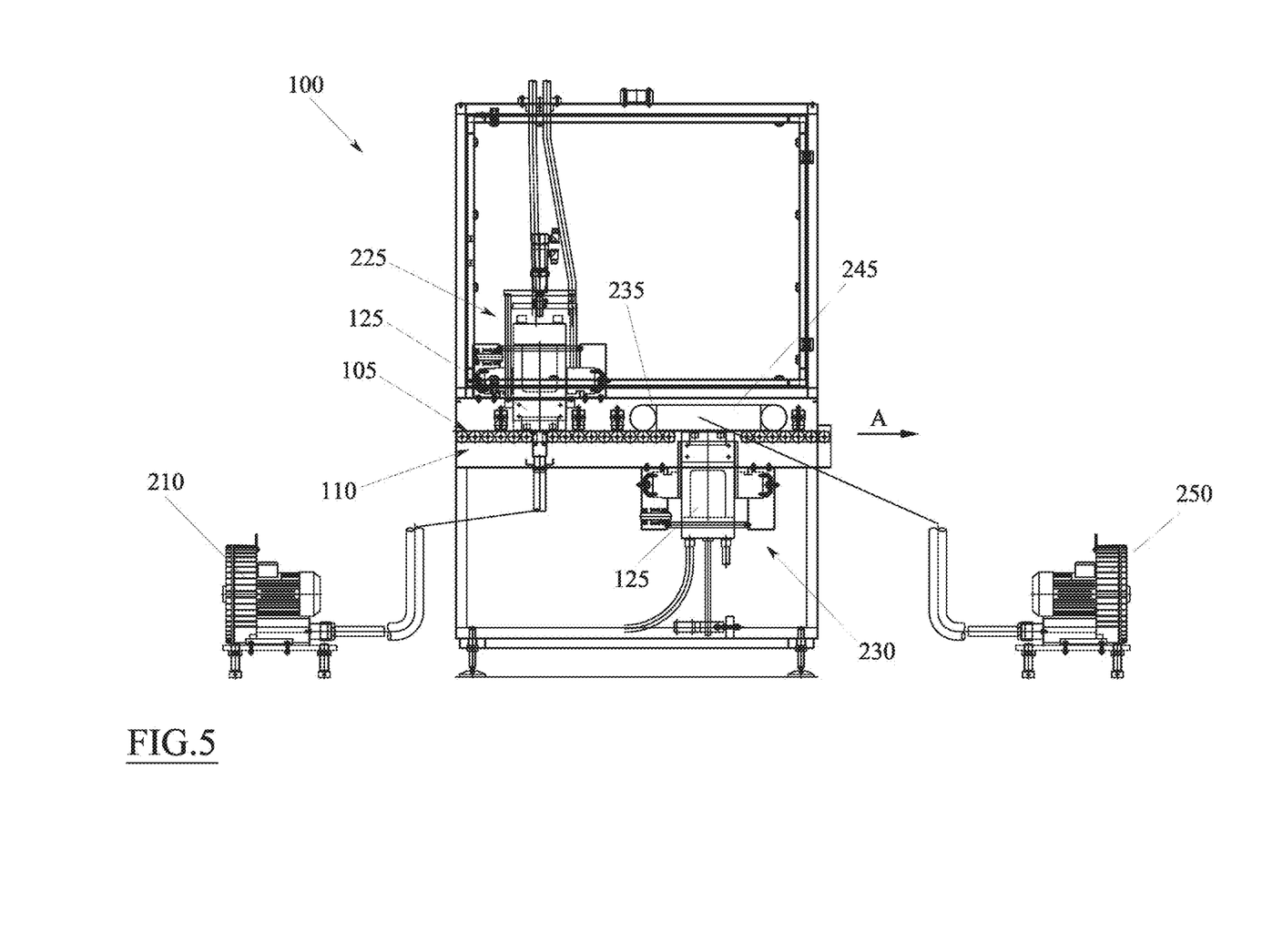
FIG. 5 is a side view of the equipment according to a different method of implementation.
Figure 6:
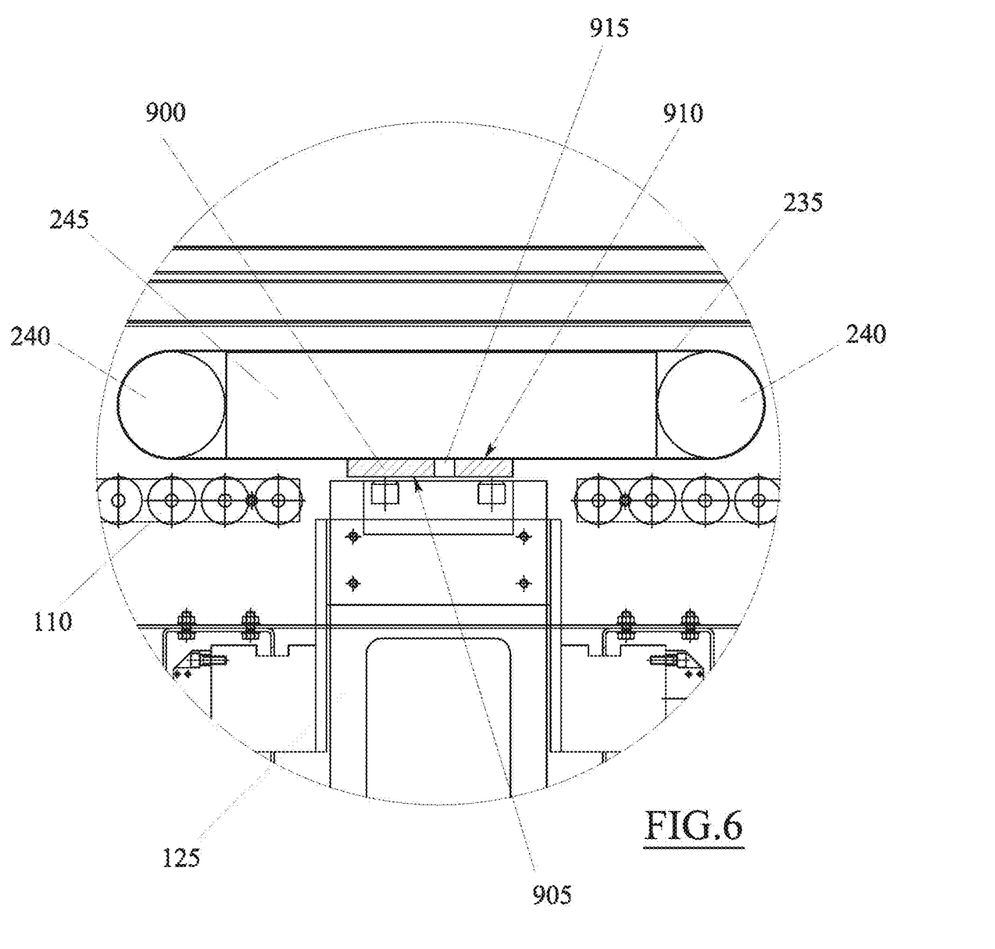
FIG. 6 shows enlarged details of FIG. 5, with a panel whose dimensions (especially thickness) have been enlarged to help identify the features.

Finally, FIGS. 5 and 6 illustrate equipment 100 that comprises two treatment units, indicated as 225 and 230 respectively, whereby the second unit 230 is situated below the first 225 with respect to the panel's 900 travel direction A. The first unit 225 is structurally similar to that illustrated in FIGS. 1 and 4, the only difference being that the dispensing nozzle 125 is larger to provide a flow of plasma with a correspondingly larger cross-section diameter (e.g. 100 mm).

The second unit 230 also comprises an additional dispensing nozzle 125 which is not linked to any intake system 200.

As outlined previously, this additional dispensing nozzle 125 is positioned beneath the support surface 105 for the panels 900, to dispense a flow of plasma upwards to treat the first side 905 of the panel 900.

Given that in this case the dispensing nozzle 125 is fairly large, the roller bed 110 defining the support surface 105 must be split into two sections situated at a relatively large distance from each other. As a result, it is unsuitable for supporting small panels 900 or panels 900 with dimensions smaller than the distance between the aforementioned sections of the roller bed 110.

To overcome this inconvenience, the equipment 100 can comprise a conveyor belt 235 wound in a closed circuit between two return rollers 240 to cover a lower operational section where the belt 235 runs along the travel direction A, and a higher return selection where the belt 235 comes back.

The conveyor belt 235 can be operated with a suitable drive mechanism (not illustrated) that rotates at least one of the return rollers 240.

The conveyor belt 235 can be positioned such that the lower section of its route has a distance from the support surface 105 provided by the roller bed 110 which is equivalent to the thickness of the panel 900.

Given that the panels 900 could have different thicknesses, the equipment 100 can be equipped with a mechanism for varying the distance of the conveyor belt 235 with respect to the support surface 105, moving the return rollers 240 in a direction which is orthogonal to the support surface 105 for example.

Therefore as illustrated in FIG. 6, the outer side of the conveyor belt 235 i.e. the side facing downwards, comes into contact with the second side 910 of the panel 900 i.e. the side facing upwards, in the lower section of its route.

The conveyor belt 235 is perforated and linked to an intake system 245 which can be housed between the lower and upper section of the route, and has an opening (not visible) facing the inside of the conveyor belt 235 in the lower section i.e. facing downwards in FIG. 6.

The equipment also comprises a suction mechanism 250 to create lower pressure in the intake system 245 and generate a suction effect through its opening and the holes (or slots) in the conveyor belt 235.

This suction effect causes the second side 910 of the panel 900 to adhere to the conveyor belt 235, which can transport it in a suspended fashion above the dispensing nozzle 125, leaving the first side 905 uncovered and therefore accessible for effective plasma treatment.

It should be noted that the unit 230 outlined above could be the subject of an independent invention with respect to the unit 225 situated above it.

Obviously an industry expert could make numerous technical modifications to the equipment above depending on the application, without departing from the scope of the invention as outlined in the claims below.

The invention claimed is:

1. A method for treating panels that are used to manufacture printed circuit boards, the method comprising:
    setting up a panel with a first side, a second side opposite the first side, and at least one through hole in a thickness direction of the panel;
    positioning an opening defined in a hollow body of an intake system in contact with the first side of the panel so the opening faces a portion of the first side containing the through hole, such that the panel closes the opening;
    generating a plasma inside a dispensing nozzle;
    ejecting the plasma externally of the dispensing nozzle as a flow of plasma; and
    creating low pressure within the intake system and simultaneously exposing at least one portion of the second side of this panel to the ejected flow of plasma, wherein the portion of the second side contains the through hole, so that the flow of plasma reaching the second side of the panel is sucked inside the through hole.

2. The method of claim 1, wherein the opening of the intake system has a width equal to a diameter of the portion on the second side exposed to the flow of plasma.

3. The method of claim 1, wherein the flow of plasma is directed in parallel with an axis of the through hole.

4. An equipment for the treatment of panels comprising:
    a support surface for a panel to be treated,
    an intake system having a hollow body and an opening defined in the hollow body, wherein the hollow body is configured to be positioned such that the opening faces a first side of the panel positioned on the support surface and edges of the hollow body defining the opening abut the first side of the panel, a suction mechanism to reduce pressure in the intake system, a dispensing nozzle to generate a plasma and provided with an outlet to eject the plasma externally of the dispensing nozzle as a flow of plasma, wherein the outlet of the dispensing nozzle is placed so that the support surface lies between the outlet of the dispensing nozzle and the opening of the intake system, and wherein the outlet of the dispensing nozzle is configured to eject the flow of plasma against a second side of the panel opposite to the first side.

5. The equipment of claim 4, wherein the support surface has an actuator mechanism to move the panel in a set horizontal travel direction.

6. The equipment of claim 5, wherein the support surface is defined by a roller bed.

7. The equipment of claim 4, wherein edges of the hollow body defining the opening of the intake system are positioned flush with the support surface.

8. The equipment of claim 4, comprising a mechanism for varying a distance of the intake system with respect to the support surface.

9. The equipment of claim 4, wherein dimensions of the opening of the intake system can be adjusted.

10. The equipment of claim 4, comprising:
sensors to measure a size of the panel situated on the support surface,
actuating mechanism to adjust a size of the opening of the intake system,
control unit connected to the sensors and actuating mechanism configured to adjust the size of the opening of the intake system in relation to a size of the panel.

11. The equipment of claim 4, comprising:
sensors to detect a presence of through holes in the panel situated on the support surface and a position of the through holes with respect to the intake system, and
a control unit connected to the sensors and configured to selectively activate the suction mechanism responsive to detection of the position of at least one of the through holes so that the at least one of the through holes faces the opening of the intake system.

12. The equipment of claim 4, comprising:
a perforated belt with a first side configured to contact the panel,
a second intake system with a second hollow body defining a second opening facing a second side of the perforated belt opposite the first side,
a suction mechanism to reduce pressure in the second intake system, and
a second nozzle dispensing a flow of plasma, which is placed so that the perforated belt lies between the second nozzle and the second intake system, the second nozzle being configured to supply a flow of plasma towards the first side of the perforated belt.

13. The equipment of claim 12, wherein the perforated belt is configured to slide.

14. The equipment of claim 5, wherein the opening of the hollow body extends, in a horizontal transversal direction orthogonal to the horizontal travel direction, at least equal to the size, in the same direction, of the panel to be treated.

15. The method of claim 1, wherein the flow of plasma is ejected freely into the air.

16. The method of claim 1, wherein the creation of the low pressure within the intake system and the simultaneous exposure of the at least one portion of the second side of the panel to the ejected flow of plasma are performed while the panel is moving in a set horizontal travel direction.

* * * * *